United States Patent
Peng et al.

(10) Patent No.: US 10,475,703 B2
(45) Date of Patent: Nov. 12, 2019

(54) STRUCTURE AND FORMATION METHOD OF DAMASCENE STRUCTURE

(71) Applicant: TAIWAN SEMICONDUCTOR MANUFACTURING CO., LTD., Hsinchu (TW)

(72) Inventors: Tai-Yen Peng, Hsinchu (TW); Chia-Tien Wu, Taichung (TW); Jye-Yen Cheng, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 136 days.

(21) Appl. No.: 15/649,321

(22) Filed: Jul. 13, 2017

(65) Prior Publication Data

US 2017/0316975 A1 Nov. 2, 2017

Related U.S. Application Data

(63) Continuation of application No. 15/171,893, filed on Jun. 2, 2016, now Pat. No. 9,721,836, which is a
(Continued)

(51) Int. Cl.
*H01L 21/768* (2006.01)
*H01L 23/532* (2006.01)
(Continued)

(52) U.S. Cl.
CPC .... *H01L 21/76897* (2013.01); *H01L 21/7681* (2013.01); *H01L 21/7684* (2013.01);
(Continued)

(58) Field of Classification Search
CPC ......... H01L 23/53238; H01L 23/53204; H01L 23/528; H01L 21/76807; H01L 21/76877; H01L 21/76843
See application file for complete search history.

(56) References Cited

U.S. PATENT DOCUMENTS 6,436,814 B1 8/2002 Horak et al.
8,765,604 B2 * 7/2014 Vannier ............ H01L 21/76802
438/627
(Continued)

FOREIGN PATENT DOCUMENTS

CN 101304019 A 11/2008
JP 2001-230219 A 8/2001
(Continued)

OTHER PUBLICATIONS

Korean Office Action, dated Mar. 28, 2016, for Korean Application No. 10-2014-0170443, with an English translation.

*Primary Examiner* — Robert G Bachner
(74) *Attorney, Agent, or Firm* — Birch, Stewart, Kolasch & Birch, LLP

(57) ABSTRACT

A semiconductor device is provided. The semiconductor device includes a semiconductor substrate and a first conductive feature over the semiconductor substrate. The semiconductor device also includes a first dielectric layer over the semiconductor substrate and surrounding the first conductive feature. The semiconductor device further includes a second conductive feature over the first conductive feature. A bottom surface of the second conductive feature is between a top surface of the first conductive feature and a bottom surface of the first conductive feature. In addition, the semiconductor device includes a second dielectric layer over the first dielectric layer and surrounding the second conductive feature. The semiconductor device also includes an etch stop layer between the first dielectric layer and the second dielectric layer. A top surface of the etch stop layer is between the top surface and the bottom surface of the first conductive feature.

20 Claims, 10 Drawing Sheets

Related U.S. Application Data continuation of application No. 14/516,222, filed on Oct. 16, 2014, now Pat. No. 9,397,045.

(51) Int. Cl.
*H01L 23/528* (2006.01)
*H01L 23/522* (2006.01)

(52) U.S. Cl.
CPC .. *H01L 21/76805* (2013.01); *H01L 21/76807* (2013.01); *H01L 21/76814* (2013.01); *H01L 21/76826* (2013.01); *H01L 21/76831* (2013.01); *H01L 21/76843* (2013.01); *H01L 21/76871* (2013.01); *H01L 21/76877* (2013.01); *H01L 23/528* (2013.01); *H01L 23/5226* (2013.01); *H01L 23/5283* (2013.01); *H01L 23/53204* (2013.01); *H01L 23/53209* (2013.01); *H01L 23/53238* (2013.01); *H01L 23/53257* (2013.01); *H01L 23/53295* (2013.01); *H01L 21/76852* (2013.01); *H01L 21/76885* (2013.01); *H01L 23/53242* (2013.01); *H01L 2924/0002* (2013.01)

(56) References Cited

U.S. PATENT DOCUMENTS

| | | |
|---|---|---|
| 2003/0071355 A1 | 4/2003 | Dubin et al. |
| 2003/0111729 A1* | 6/2003 | Leu ............... H01L 21/288 257/758 |
| 2006/0115976 A1 | 6/2006 | Chan et al. |
| 2007/0267751 A1 | 11/2007 | Yang et al. |
| 2008/0044999 A1 | 2/2008 | Dubin et al. |
| 2008/0246148 A1* | 10/2008 | Won ............... H01L 21/76843 257/746 |
| 2012/0153490 A1 | 6/2012 | Vannier |
| 2014/0151893 A1* | 6/2014 | Boyanov ........... H01L 23/5329 257/774 |
| 2014/0183738 A1 | 7/2014 | Jezewski et al. |
| 2014/0264922 A1 | 9/2014 | Chen et al. |

FOREIGN PATENT DOCUMENTS

| | | |
|---|---|---|
| KR | 1999-003873 A | 1/1999 |
| KR | 10-2005-0068868 A | 7/2005 |
| KR | 10-2009-0092926 A | 9/2009 |

\* cited by examiner

STRUCTURE AND FORMATION METHOD OF DAMASCENE STRUCTURE

CROSS REFERENCE

This application is a Continuation application of U.S. patent application Ser. No. 15/171,893, filed on Jun. 2, 2016, which is a Continuation application of U.S. patent application Ser. No. 14/516,222, filed on Oct. 16, 2014 (now U.S. Pat. No. 9,397,045 issued Jul. 19, 2016), the entirety each of which are incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while feature size (i.e., the smallest component that can be created using a fabrication process) has decreased. This scaling-down process generally provides benefits by increasing production efficiency and lowering associated costs.

One method used by the industry to meet the demand for device density is the adoption of damascene and dual-damascene structures for interconnect structures. In a damascene process, an underlying insulating layer is patterned with open trenches. Afterwards, a conductor is deposited and polished to the level of the insulating layer to form a patterned conductor feature. Dual-damascene processes use a similar approach in that two features (a trench and a via hole) are formed and filled with a single deposition of conductor.

However, as feature sizes shrink further and density requirements increase, the pitch between features, such as interconnect structures, decreases. As a result, fabrication processes continue to become more difficult to perform. It is a challenge to form interconnect structures with shorter and shorter pitches in a semiconductor device.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
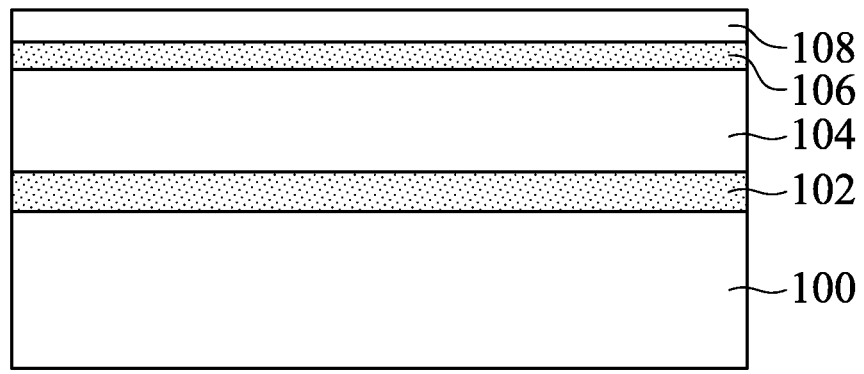
FIGS. 1A-1M are cross-sectional views of various stages of a process for forming a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1M are perspective views of various stages of a process for forming a semiconductor device, in accordance with some embodiments. Additional operations can be provided before, during, and/or after the stages described in FIGS. 1A-1M. Some of the stages described can be replaced or eliminated for different embodiments. Additional features can be added in the semiconductor device. Some of the features described below can be replaced or eliminated for different embodiments.

As shown in FIG. 1A, a semiconductor substrate 100 is provided. In some embodiments, the semiconductor substrate 100 is a bulk semiconductor substrate, such as a semiconductor wafer. For example, the semiconductor substrate 100 includes silicon or other elementary semiconductor materials such as germanium. In some other embodiments, the semiconductor substrate 100 includes a compound semiconductor. The compound semiconductor may include silicon carbide, gallium arsenide, indium arsenide, indium phosphide, another suitable compound semiconductor, or a combination thereof. In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, isolation features (not shown) are formed in the semiconductor substrate 100 to define and isolate various device elements (not shown) formed in the semiconductor substrate 100. The isolation features include, for example, trench isolation (STI) features or local oxidation of silicon (LOCOS) features.

Examples of the various device elements that may be formed in the semiconductor substrate 100 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field effect transistors (PFETs/NFETs), etc.), diodes, another suitable element, or a combination thereof. Various processes are performed to form the various device elements, such as deposition, etching, implantation, photolithography, annealing, planarization, another applicable process, or a combination thereof.

As shown in FIG. 1A, an etch stop layer 102 is deposited over the semiconductor substrate 100, in accordance with some embodiments. In some embodiments, the etch stop layer 102 is formed over an interconnect structure (not shown) which includes one or more dielectric layers and one or more conductive features. For example, the interconnect structure includes contact plugs which are electrically connected to the device elements formed in the semiconductor substrate 100. The etch stop layer 102 may be used to prevent the interconnect structure or device elements thereunder from being damaged during subsequent etching processes.

In some embodiments, the etch stop layer 102 is made of silicon carbide (SiC), silicon carbo-nitride (SiCN), silicon oxycarbide (SiCO), silicon nitride (SiN), silicon oxynitride (SiON), another suitable material, or a combination thereof. In some embodiments, the etch stop layer 102 is deposited using a chemical vapor deposition (CVD) process, a spin-on process, another applicable process, or a combination thereof. Embodiments of the disclosure have many variations. In some other embodiments, the etch stop layer 102 is not formed.

As shown in FIG. 1A, a dielectric layer 104 is deposited over the etch stop layer 102, in accordance with some embodiments. The dielectric layer 104 serves as an inter-metal dielectric (IMD) layer. In some embodiments, the dielectric layer 104 is made of a low-k dielectric material. The low-k dielectric material has a dielectric constant smaller than that of silicon dioxide. For example, the low-k dielectric material has a dielectric constant in a range from about 1.2 to about 3.5.

As the density of semiconductor devices increases and the size of circuit elements becomes smaller, the resistance capacitance (RC) delay time increasingly dominates circuit performance. Using a low-k dielectric material as the dielectric layer 104 is helpful for reducing the RC delay.

In some embodiments, the dielectric layer 104 includes a spin-on inorganic dielectric, a spin-on organic dielectric, a porous dielectric material, an organic polymer, an organic silica glass, SiOF series material, a hydrogen silsesquioxane (HSQ) series material, a methyl silsesquioxane (MSQ) series material, a porous organic series material, another suitable material, or a combination thereof. In some embodiments, the dielectric layer 104 includes a material including Si, C, O, or H. For example, the dielectric layer 104 includes $SiO_2$, SiOC, SiON, SiCOH, SiOCN, or a combination thereof. In some embodiments, the dielectric layer 104 is made of carbon-doped silicon oxide. The carbon-doped silicon oxide may also be referred to as organosilicate glass (OSG) or C-oxide. In some embodiments, the carbon-doped silicon oxide includes methyl silsesquioxane (MSQ), hydrogen silsesquioxane (HSQ), polysilsesquioxane, another suitable material, or a combination thereof. In some embodiments, the dielectric layer 104 includes fluorine-doped silicate glass (FSG) such as fluorine-doped —(O—Si(CH$_3$)$_2$—O)—. In some embodiments, the dielectric layer 104 is deposited using a CVD process, a spin-on process, a spray coating process, another applicable process, or a combination thereof.

As shown in FIG. 1A, an etch stop layer 106 is deposited over the dielectric layer 104, in accordance with some embodiments. The etch stop layer 106 will then be patterned and will be used to protect the underlying portion of the dielectric layer 104 from being etched during subsequent etching processes. In some embodiments, the etch stop layer 106 is made of a material that is different from that of the etch stop layer 102.

In some embodiments, the etch stop layer 106 is made of a nitride material. In some other embodiments, the etch stop layer 106 is made of an oxide material, a nitride material, a carbide material, another suitable material, or a combination thereof. For example, the etch stop layer 106 is made of silicon carbide (SiC), silicon carbo-nitride (SiCN), silicon oxycarbide (SiCO), silicon nitride (SiN), silicon oxynitride (SiON), another suitable material, or a combination thereof. In some embodiments, the etch stop layer 106 is deposited using a chemical vapor deposition (CVD) process, a spin-on process, another applicable process, or a combination thereof. Embodiments of the disclosure have many variations. In some other embodiments, the etch stop layer 106 is not formed.

As shown in FIG. 1A, a dielectric layer 108 is deposited over the etch stop layer 106, in accordance with some embodiments. In some embodiments, the material and formation method of the dielectric layer 108 are similar to those of the dielectric layer 104 mentioned above.

Figure 1B:
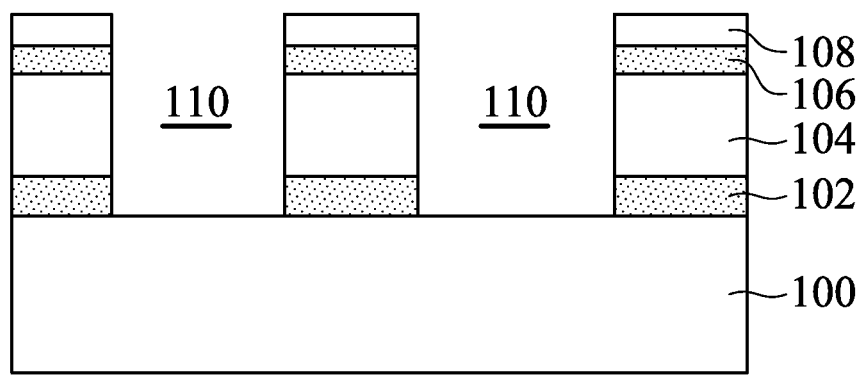

As shown in FIG. 1B, portions of the dielectric layer 108, the etch stop layer 106, the dielectric layer 104, and the etch stop layer 102 are removed to form one or more openings 110, in accordance with some embodiments. In some embodiments, each of the openings 110 exposes the interconnect structure or device element under the etch stop layer 102. In some embodiments, the openings 110 are trenches where conductive lines will be formed. In some embodiments, the openings 110 are formed using photolithography and etching processes. Various etchants may be used sequentially to form the openings 110.

Figure 1C:
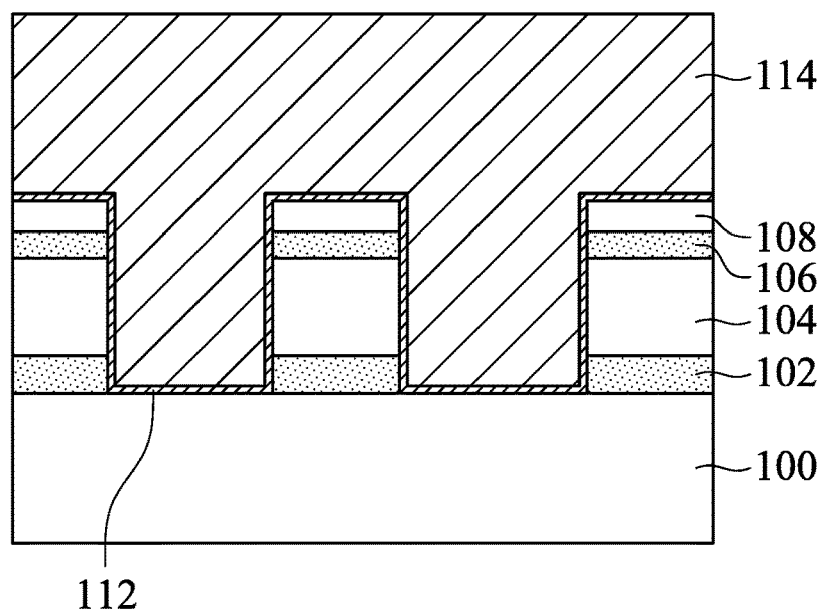

As shown in FIG. 1C, a barrier layer 112 is deposited over the dielectric layer 108 and bottoms and sidewalls of the openings 110, in accordance with some embodiments. Afterwards, a conductive layer 114 is deposited over the barrier layer 112, as shown in FIG. 1C in accordance with some embodiments. The barrier layer 112 is used to protect the dielectric layers 108 and 104 from diffusion of a metal material from the conductive layer 114. The barrier layer 112 may also serve as an adhesion layer between the conductive layer 114 and the dielectric layer 104 or 108.

In some embodiments, the barrier layer 112 is made of titanium nitride, tantalum nitride, titanium, tungsten nitride, another suitable material, or a combination thereof. In some embodiments, the barrier layer 112 is deposited using a physical vapor deposition (PVD) process, a CVD process, an atomic layer deposition (ALD) process, an electroless plating process, another applicable process, or a combination thereof.

In some embodiments, the conductive layer 114 is made of copper, aluminum, tungsten, titanium, nickel, gold, platinum, another suitable conductive material, or a combination thereof. In some embodiments, the conductive layer 114 is deposited using an electrochemical plating process, an electroless plating process, a PVD process, a CVD process, a spin-on process, another applicable process, or a combination thereof.

In some embodiments, a seed layer (not shown) is deposited over the barrier layer 112 before the conductive layer 114 is deposited, in accordance with some embodiments. In some embodiments, the seed layer is formed conformally over the barrier layer 112. The seed layer is used to assist in the formation of the conductive layer 114.

In some embodiments, the seed layer is made of copper or copper alloy. In some embodiments, the seed layer includes copper, silver, gold, titanium, aluminum, tungsten, another suitable material, or a combination thereof. In some embodiments, the seed layer is deposited using a PVD process, a CVD process, another applicable process, or a combination thereof. Embodiments of the disclosure have many variations. In some other embodiments, the seed layer is not formed.

Figure 1D:
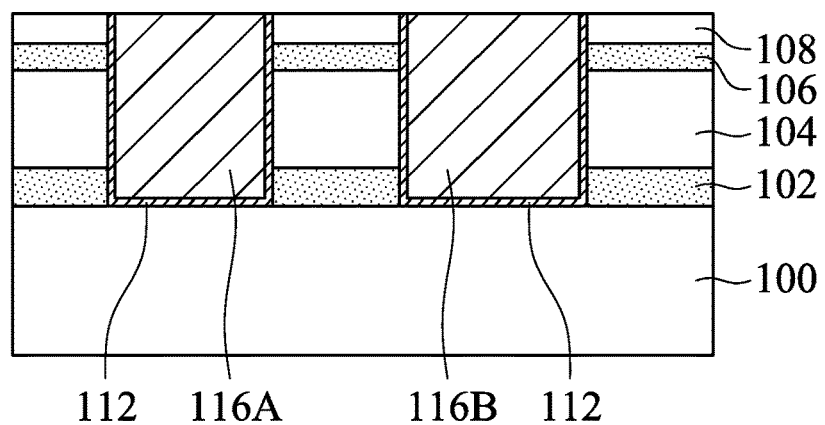

As shown in FIG. 1D, the portions of the conductive layer 114 and the barrier layer 112 outside of the openings 110 are removed, in accordance with some embodiments. As a result, conductive features 116A and 116B are formed. As shown in FIG. 1D, the conductive features 116A and 116B are surrounded by the etch stop layers 102 and 106 and the dielectric layer 104 and 108. In some embodiments, the conductive features 116A and 116B are conductive lines which are electrically connected to corresponding device elements formed in or on the semiconductor substrate 100. For example, contact plugs (not shown) of the interconnect structure are used to form electrical connections between the conductive features and the device elements.

In some embodiments, a planarization process is performed on the conductive layer 114 until the dielectric layer 108 is exposed. The planarization process may include a chemical mechanical polishing (CMP) process, a grinding process, an etching process, another applicable process, or a combination thereof.

Figure 1E:
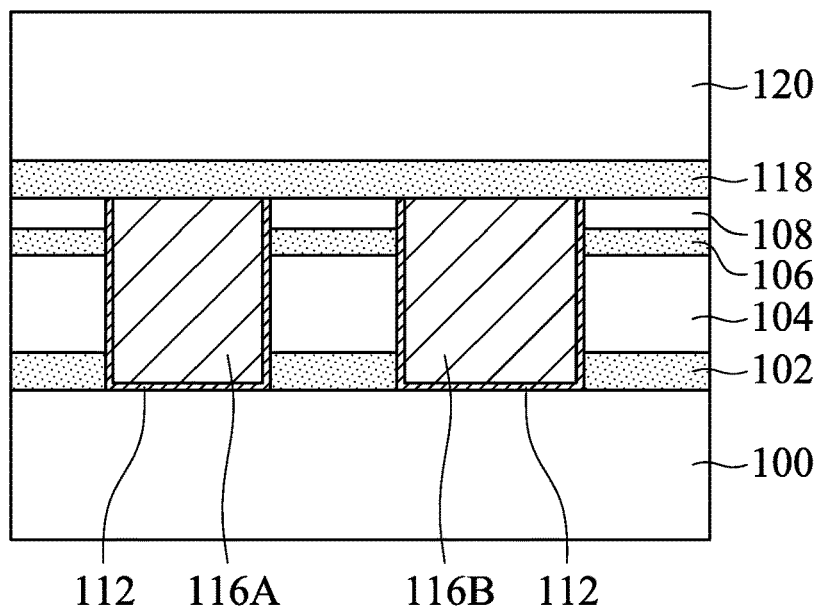

As shown in FIG. 1E, an etch stop layer 118 and a dielectric layer 120 are deposited over the dielectric layer 108 and the conductive features 116A and 116B, in accordance with some embodiments. In some embodiments, the material and formation method of the etch stop layer 118 are similar to those of the etch stop layer 102. In some embodiments, the material and formation method of the dielectric layer 120 are similar to those of the dielectric layer 104.

Figure 1F:
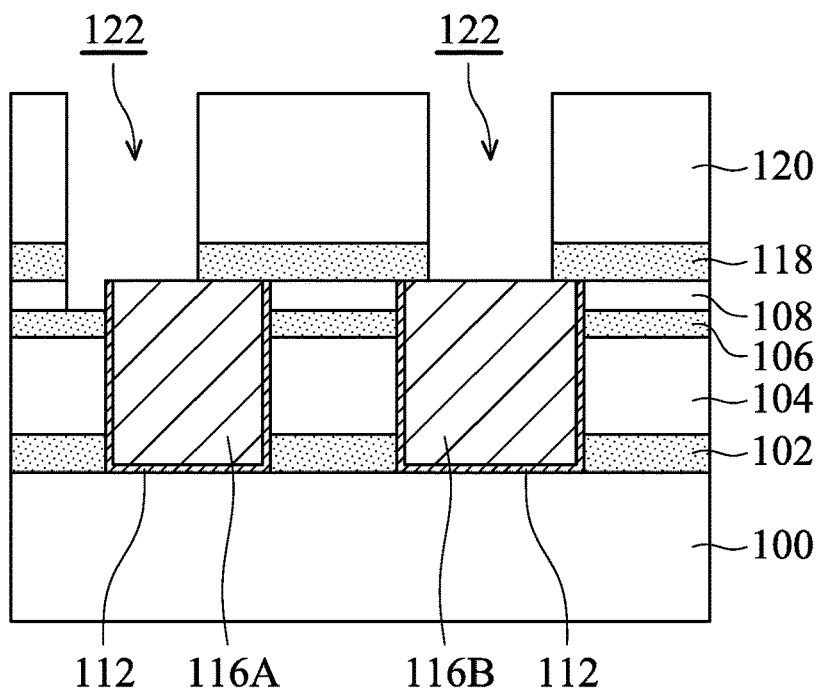

As shown in FIG. 1F, portions of the dielectric layer 120 and the etch stop layer 118 are removed to form one or more holes 122, in accordance with some embodiments. In some embodiments, the holes 122 expose the conductive features 116A and 116B. In some embodiments, the holes 122 are used as via holes where conductive vias will be formed. In some embodiments, the holes 122 are formed using photolithography processes and etching processes. Various etchants may be used sequentially to form the holes 122.

As the feature size of the semiconductor device continues to decrease, lithography overlay control is getting harder and harder. In some cases, a misalignment or shifting between the hole 122 and the conductive feature 116A or 116B might occur. As shown in FIG. 1F, in some cases, a misalignment between the conductive feature 116A and the hole 122 occurs. Not only the top of the conductive feature 116A, but also the barrier layer 112 on the sidewall of the conductive feature 116A are exposed by the hole 122. The etch stop layer 106 may protect the dielectric layer 108 thereunder from being etched during the formation of the holes 122.

Figure 1G:
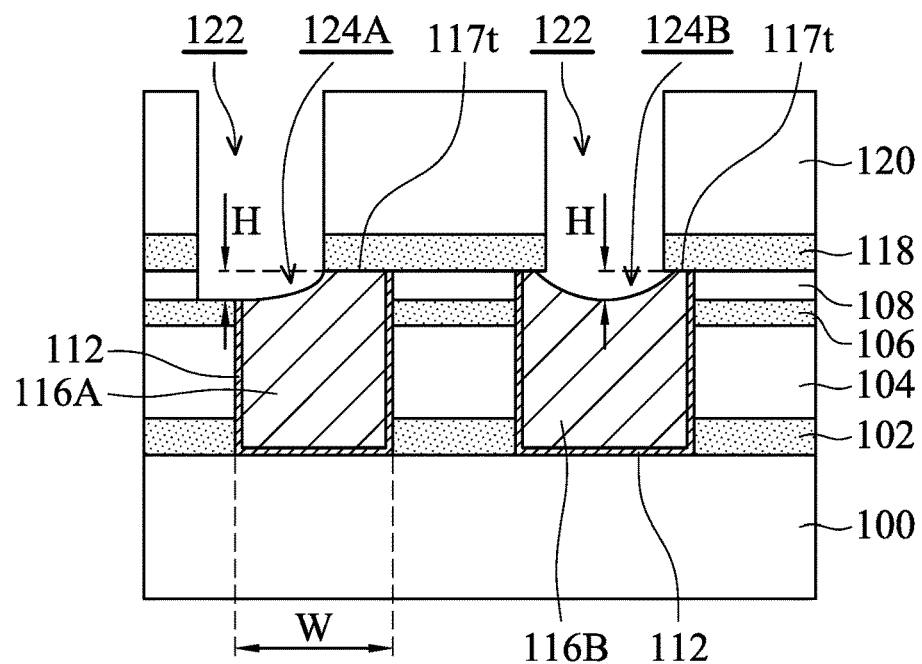

As shown in FIG. 1G, portions of the conductive features 116A and 116B are removed to form recesses 124A and 124B, in accordance with some embodiments. In some embodiments, the conductive features 116A and 116B are partially removed by a chemical treatment. The chemical treatment involves the application of one or more liquid and/or gaseous removing agents. In some embodiments, a wet etching process and/or a dry etching process are/is used to recess the conductive features 116A and 116B. The etch stop layer 106 may protect the dielectric layer 108 thereunder from being damaged during the formation of the recesses 124A and 124B.

As shown in FIG. 1G, each of the recesses 124A and 124B has a depth H. The depth H is the distance between the bottom of the recess 124A or 124B and the top surface 117t of the conductive feature 116A or 116B. In some embodiments, the depth H of the recess 124A is substantially equal to that of the recess 124B. In some other embodiments, the depths of the recesses 124A and 124B are different from each other.

Figure 1H:
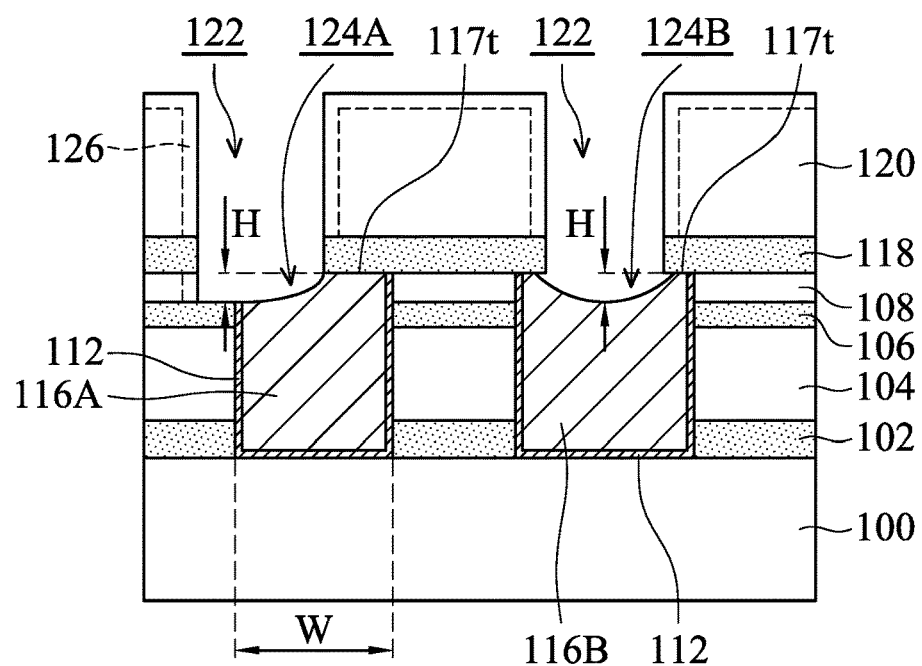

In some embodiments, the depth H is in a range from about 5 nm to about 20 nm. As shown in FIG. 1H, each of the conductive features 116A and 116B has a width W. The width W may be in a range from about 7 nm to about 20 nm. In some embodiments, the ratio of the depth H to the width W (H/W) is in a range from about 0.33 to about 1. In some other embodiments, the ratio of the depth H to the width W (H/W) is in a range from about 0.25 to about 2.85.

As shown in FIG. 1H, a barrier region 126 is formed in the dielectric layer 120, in accordance with some embodiments. In some embodiments, the barrier region 126 surrounds the holes 122. In some embodiments, the barrier region 126 is also formed in the dielectric layer 108. The barrier region 126 is used to protect the dielectric layers 120 and 108 from diffusion of a metal material from conductive features which will be formed in the holes 122. In these cases, no barrier layer is formed over sidewalls of the holes 122.

In some embodiments, the barrier region 126 is a doped region of the dielectric layer 120 and 108. The barrier region 126 includes dopants such as nitrogen, hydrogen, another suitable dopant, or a combination thereof. In some embodiments, the barrier region 126 is formed using a plasma treatment, a soaking treatment, another suitable treatment, or a combination thereof. Reaction gas including, for example, $H_2$, $N_2$, Ar, another suitable reaction gas, or a combination thereof is used to form the barrier region 126. For example, a processing pressure in a range from about 1 mTorr to about 100 Torrs and a processing temperature in a range from about 25 degrees C. to about 400 degrees C. may be used. In some embodiments, the barrier region 126 is denser than other portions of the dielectric layer 120.

Embodiments of the disclosure have many variations and are not limited to the embodiments mentioned above. In some other embodiments, the barrier region 126 is not formed. In some embodiments, a barrier layer (not shown) is formed over sidewalls of the holes 122. The material and formation method of the barrier layer may be similar to those of the barrier layer 112.

Figure 1I:
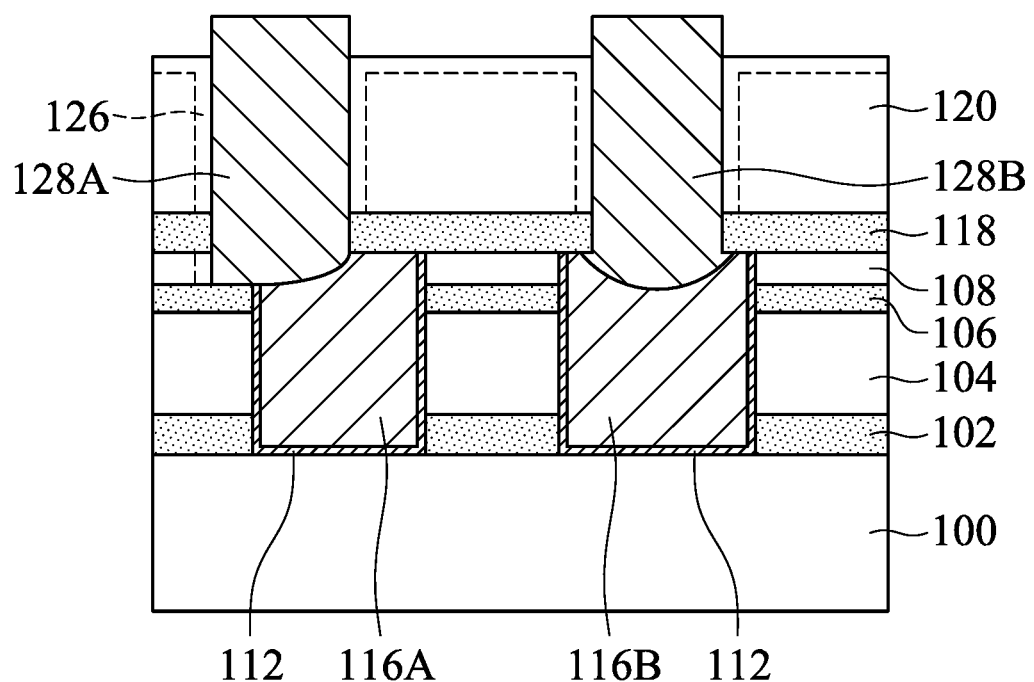

As shown in FIG. 1I, conductive features 128A and 128B are formed in the holes 122 and the recesses 124A and 124B, in accordance with some embodiments. As shown in FIG. 1I, the conductive features 128A and 128B are surrounded by the etch stop layer 118 and the dielectric layers 120 and 108. In some embodiments, the conductive features 128A and 128B protrude above the dielectric layer 120.

In some embodiments, the conductive features 128A and 128B are used as conductive vias which are electrically connected to the conductive features 116A and 116B, respectively. In some embodiments, the conductive features 128A and 128B are in direct contact with the conductive features 116A and 116B, respectively. No barrier layer which has a higher resistance is formed between the conductive features 116A and 128A or between the conductive features 116B and 128B. The performance of the semiconductor device is therefore improved.

As mentioned above, the barrier region 126 may be used to prevent a metal material of the conductive features 128A and 128B from further diffusing into the dielectric layer 120. The barrier region 126 may also be used to improve adhesion between the conductive features 128A and 128B and the dielectric layer 120.

In some embodiments, the conductive features 128A and 128B are made of cobalt. In some other embodiments, the conductive features 128A and 128B are made of cobalt, titanium, nickel, gold, silver, platinum, tungsten, palladium, copper, another suitable material, or a combination thereof. In some embodiments, the conductive features 128A and 128B are made of a material that is different from that of the conductive features 116A and 116B. For example, the conductive features 128A and 128B are made of (or contain) cobalt, and the conductive features 116A and 116B are made of (or contain) copper.

Embodiments of the disclosure have many variations. In some other embodiments, the conductive features 128A and 128B and the conductive features 116A and 116B are made of the same material. For example, the conductive features 128A and 128B and the conductive features 116A and 116B are made of copper.

In some embodiments, the conductive features 128A and 128B are formed directly on the conductive features 116A and 116B, respectively. In some embodiments, the conductive features 128A and 128B are formed by a CVD process, a PVD process, an electroless deposition process, an electrochemical deposition process, another applicable process, or a combination thereof.

As shown in FIG. 1I, the conductive features 128A and 128B extend respectively into the conductive features 116A and 116B, in accordance with some embodiments. In other words, the conductive features 128A and 128B are partially embedded in the conductive features 116A and 116B, respectively. The conductive feature 116A surrounds a portion of the conductive feature 128A. The conductive feature 116B also surrounds a portion of the conductive feature 128B. As a result, the contact area between the conductive features 128A and 116A and the contact area between the conductive features 128B and 116B are increased. Therefore, resistance between the conductive features 128A and 116A (or between 128B and 116B) is significantly reduced. The device's performance and reliability are improved.

Even if a misalignment or shifting between the conductive features (such as between 128A and 116A) occurs, the contact area therebetween is still large enough. The resistance between the conductive features 128A and 116A can be maintained within an acceptable range.

Figure 1J:
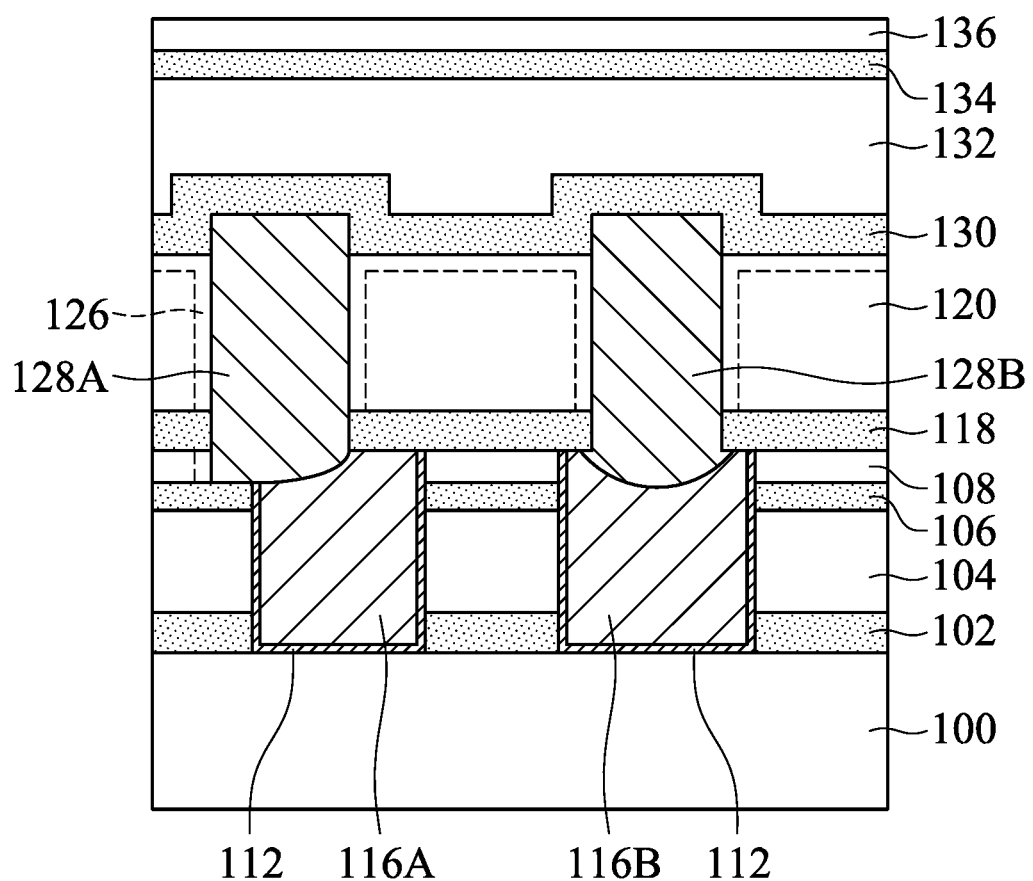

As shown in FIG. 1J, an etch stop layer 130 is deposited over the dielectric layer 120 and the conductive features 128A and 128B, in accordance with some embodiments. In some embodiments, the material and formation method of the etch stop layer 130 are similar to those of the etch stop layer 102. Afterwards, a dielectric layer 132 is deposited over the etch stop layer 130, as shown in FIG. 1J in accordance with some embodiments. In some embodiments, the material and formation method of the dielectric layer 132 are similar to those of the dielectric layer 104. In some embodiments, a planarization process is performed on the dielectric layer 132 to provide the dielectric layer 132 a substantially planar top surface. The planarization process may include a CMP process, a grinding process, an etching process, another applicable process, or a combination thereof.

As shown in FIG. 1J, an etch stop layer 134 and a dielectric layer 136 are sequentially deposited over the dielectric layer 132, in accordance with some embodiments. In some embodiments, the material and formation method of the etch stop layer 134 are similar to those of the etch stop layer 106. In some embodiments, the material and formation method of the dielectric layer 136 are similar to those of the dielectric layer 104. Embodiments of the disclosure have many variations. In some other embodiments, the etch stop layer 134 is not formed. In some other embodiments, the dielectric layer 136 is not formed.

Figure 1K:
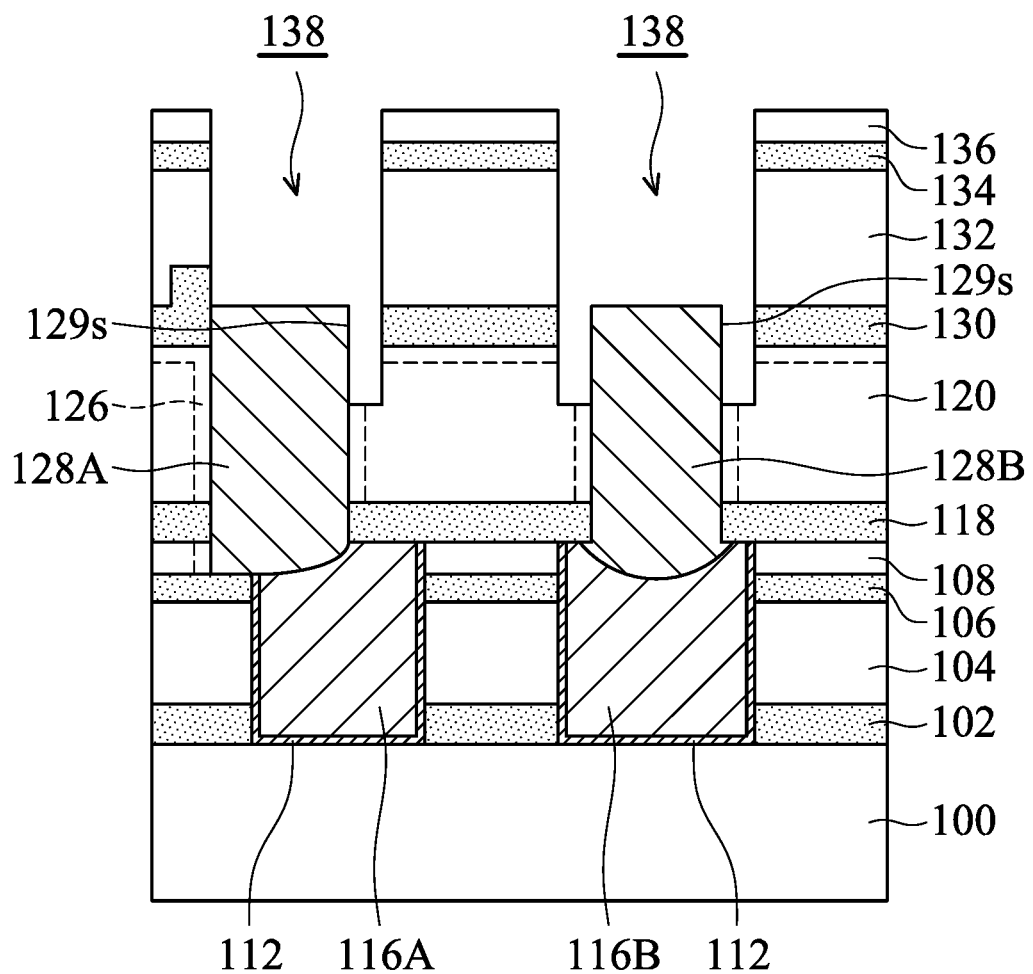

As shown in FIG. 1K, portions of the dielectric layer 136, the etch stop layer 134, the dielectric layer 132, and the etch stop layer 130 are removed to form one or more openings 138, in accordance with some embodiments. In some embodiments, the openings 138 expose top surfaces of the conductive features 128A and 128B. In some embodiments, the openings 138 also expose sidewalls 129s of the conductive features 128A and 128B. In some embodiments, the openings 138 are trenches where conductive lines will be formed. In some embodiments, the openings 138 are formed using photolithography and etching processes. Various etchants may be used sequentially to form the openings 138.

Figure 1L:
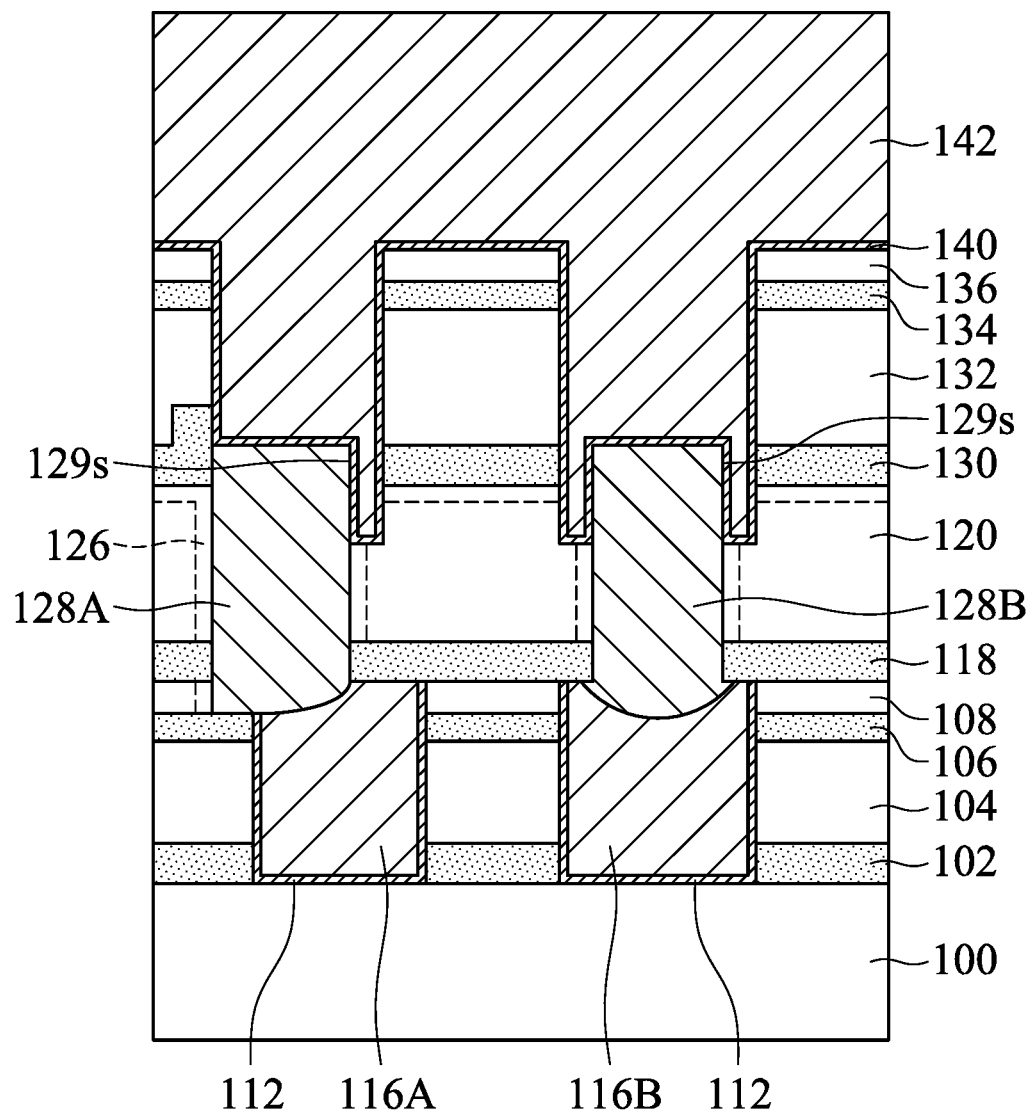

As shown in FIG. 1L, a barrier layer 140 is deposited over the dielectric layer 136, sidewalls of the openings 138, and the conductive features 128A and 128B, in accordance with some embodiments. In some embodiments, the material and formation method of the barrier layer 140 are similar to those of the barrier layer 112. Afterwards, a conductive layer 142 is deposited over the barrier layer 140 to fill the openings 138, as shown in FIG. 1L in accordance with some embodiments. In some embodiments, the material and formation method of the conductive layer 142 are similar to those of the conductive layer 114. In some embodiments, the conductive layer 142 is made of a material that is different from that of the conductive features 128A and 128B.

Figure 1M:
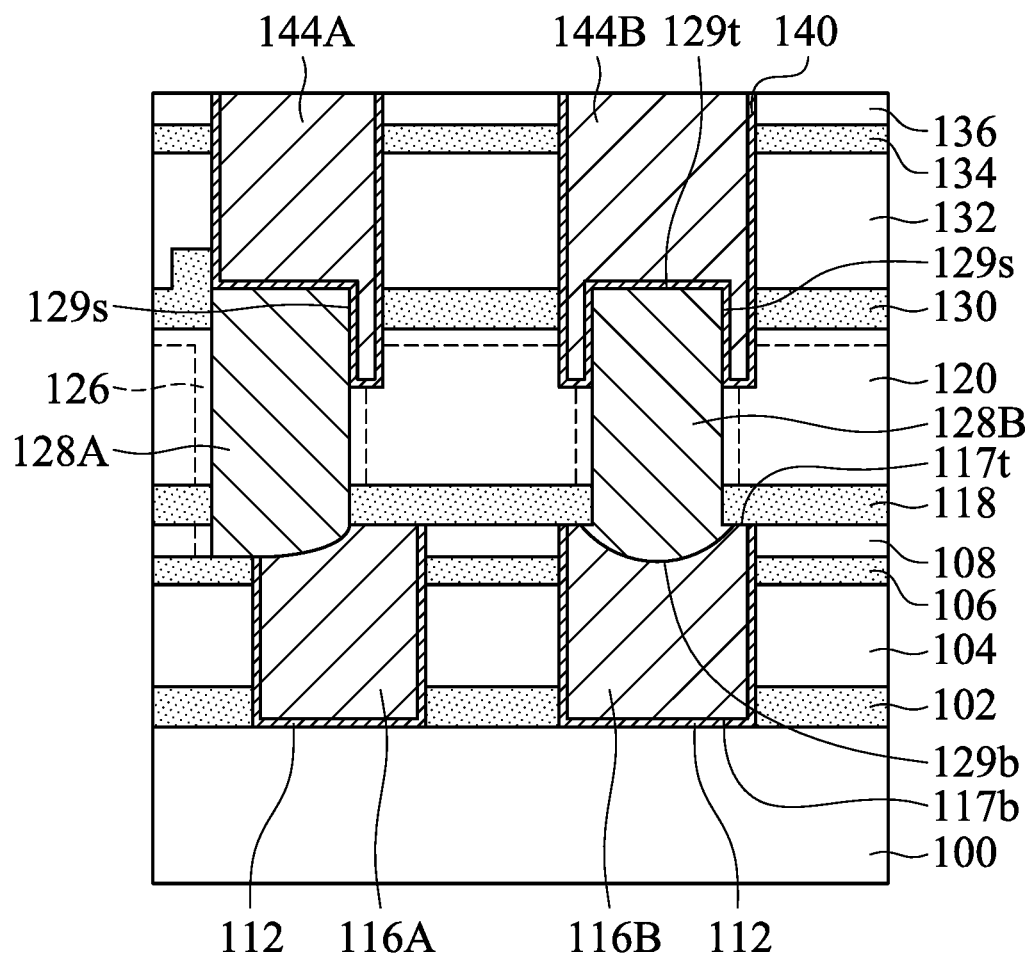

As shown in FIG. 1M, the portions of the conductive layer 142 and the barrier layer 140 outside of the openings 138 are removed, in accordance with some embodiments. As a result, conductive features 144A and 144B are formed. As shown in FIG. 1M, the conductive features 144A and 144B are surrounded by the etch stop layers 130 and 134 and the dielectric layer 132 and 136. In some embodiments, the conductive features 144A and 144B are conductive lines which are electrically connected to the conductive features 128A and 128B, respectively.

In some embodiments, a planarization process is performed on the conductive layer 142 until the dielectric layer 136 is exposed. The planarization process may include a chemical mechanical polishing (CMP) process, a grinding process, an etching process, another applicable process, or a combination thereof.

As shown in FIG. 1M, the conductive feature 144A surrounds a portion of the conductive feature 128A, in accordance with some embodiments. Similarly, the conductive feature 144B surrounds a portion of the conductive feature 128B. In other words, the conductive features 128A and 128B extend respectively into the conductive features 144A and 144B, as shown in FIG. 1M in accordance with some embodiments. Therefore, the contact area between the conductive features 128A and 144A and the contact area between the conductive features 128B and 144B are increased. Resistance between the conductive features 128A and 144A (or between 128B and 144B) is significantly reduced. Device performance and reliability are improved.

Even if a misalignment or shifting between the conductive features (such as between 128A and 144A) occurs, the contact area therebetween is still large enough. The resistance between the conductive features 128A and 144A can be maintained within an acceptable range.

In some embodiments, the bottom surface 129b of the conductive feature 128A (or 128B) is between the top surface 117t and the bottom surface 117b of the conductive feature 116A (or 116B). Similarly, the top surface 129t of the conductive feature 128A (or 128B) is between the top surface and the bottom surface of the conductive feature 144A (or 144B).

Figure 2:
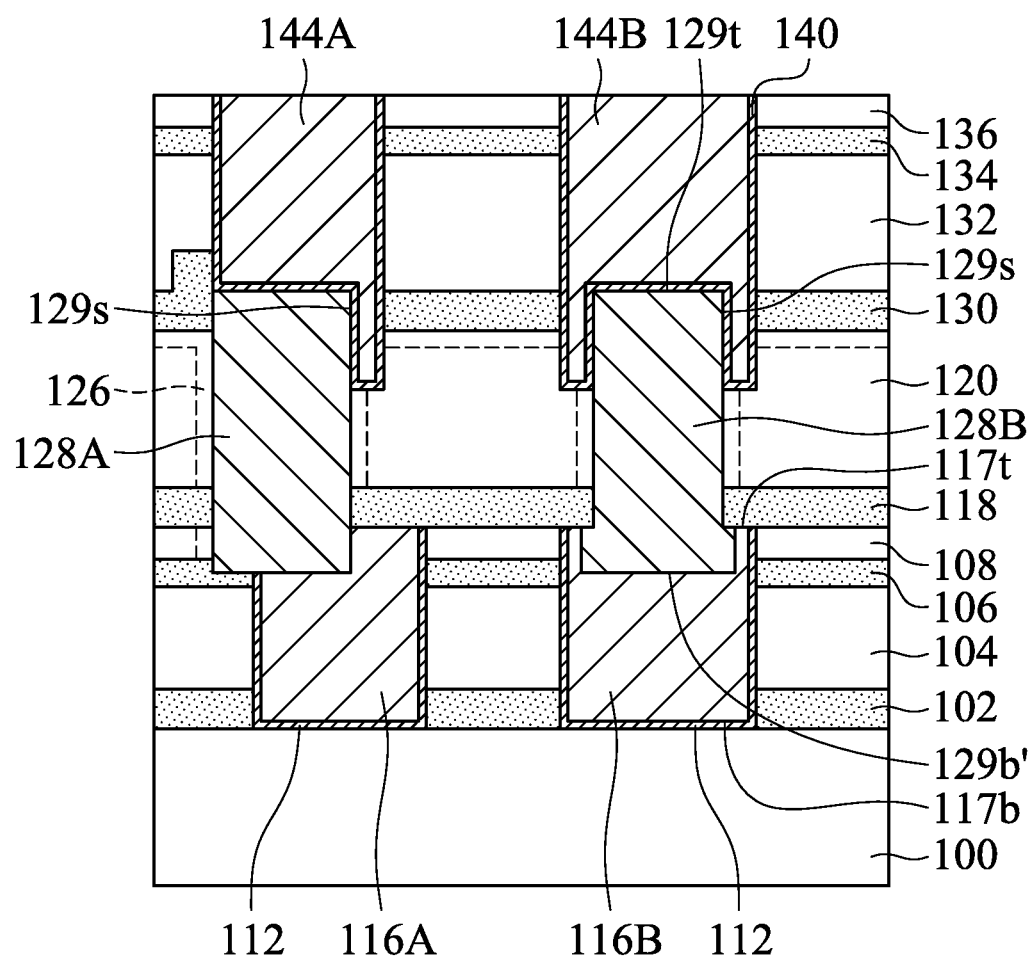
FIG. 2 is a cross-sectional view of a semiconductor device, in accordance with some embodiments.

In some embodiments, the bottom surface 129b of the conductive feature 128A or 128B is a curved surface, as shown in FIG. 1M. However, it should be appreciated that embodiments of the disclosure are not limited thereto. FIG. 2 is a cross-sectional view of a semiconductor device, in accordance with some embodiments. In these embodiments, the bottom surface 129b' of the conductive feature 128A or 128B is a substantially planar surface. The profile of the conductive feature 128A and 128B may be varied by tuning the profile of the recesses 124A and 124B. For example, etching conditions are adjusted to form the recesses 124A and 124B with the desired profile.

Embodiments of the disclosure provide structures and formation methods of a semiconductor device with damascene structures. An underlying conductive feature (such as a conductive line) is recessed before an overlying conductive feature (such as a conductive via) is formed on the underlying conductive line. Contact area between the stacked conductive features is increased. Even if a misalignment or shifting between the stacked conductive features might occur, the contact area therebetween is still large enough to maintain the resistance therebetween in an acceptable range. Device performance and reliability are significantly improved.

In accordance with some embodiments, a semiconductor device is provided. The semiconductor device includes a semiconductor substrate and a first conductive feature over the semiconductor substrate. The semiconductor device also includes a first dielectric layer over the semiconductor substrate and surrounding the first conductive feature. The semiconductor device further includes a second conductive feature over the first conductive feature, and the second conductive feature extends into the first conductive feature. In addition, the semiconductor device includes a second dielectric layer over the first dielectric layer and surrounding the second conductive feature.

In accordance with some embodiments, a semiconductor device is provided. The semiconductor device includes a semiconductor substrate and a first conductive feature over the semiconductor substrate, and the first conductive feature has a recess. The semiconductor device also includes a first dielectric layer over the semiconductor substrate and surrounding the first conductive feature. The semiconductor device further includes a second conductive feature over the first conductive feature, and a portion of the second conductive feature is in the recess of the first conductive feature. In addition, the semiconductor device includes a second dielectric layer over the first dielectric layer and surrounding the second conductive feature.

In accordance with some embodiments, a method for forming a semiconductor device is provided. The method includes forming a first dielectric layer over a semiconductor substrate and forming a first conductive feature in the first dielectric layer. The method also includes forming a second dielectric layer over the first dielectric layer and forming a hole in the second dielectric layer to expose the first conductive feature. The method further includes partially removing the first conductive feature to form a recess. In addition, the method includes forming a second conductive feature in the hole and the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
a semiconductor substrate;
a first conductive feature over the semiconductor substrate;
a first dielectric layer over the semiconductor substrate and surrounding the first conductive feature;
a second conductive feature over the first conductive feature, wherein a bottom surface of the second conductive feature is between a top surface of the first conductive feature and a bottom surface of the first conductive feature;
a second dielectric layer over the first dielectric layer and surrounding the second conductive feature; and
an etch stop layer between the first dielectric layer and the second dielectric layer, wherein a topmost surface of the etch stop layer is between the top surface of the first conductive feature and the bottom surface of the first conductive feature, and the topmost surface of the etch stop layer is substantially planar.

2. The semiconductor device as claimed in claim 1, wherein the first conductive feature and the second conductive feature are made of different materials.

3. The semiconductor device as claimed in claim 1, wherein the second conductive feature comprises cobalt.

4. The semiconductor device as claimed in claim 1, further comprising a doped barrier region formed in the second dielectric layer, wherein the doped barrier region surrounds the second conductive feature.

5. The semiconductor device as claimed in claim 1, wherein the first conductive feature is in direct contact with the second conductive feature.

6. The semiconductor device as claimed in claim 1, further comprising:
a third conductive feature over the second conductive feature; and
a third dielectric layer over the second dielectric layer and surrounding the third conductive feature.

7. The semiconductor device as claimed in claim 6, wherein the second conductive feature extends into the third conductive feature.

8. The semiconductor device as claimed in claim 7, further comprising a barrier layer between the second conductive feature and the third conductive feature.

9. The semiconductor device as claimed in claim 1, further comprising:
an intermediate dielectric layer between the etch stop layer and the second dielectric layer, wherein the intermediate dielectric layer surrounds a portion of the first conductive feature and a portion of the second conductive feature.

10. The semiconductor device as claimed in claim 9, further comprising a second etch stop layer between the second dielectric layer and the intermediate dielectric layer.

11. A semiconductor device, comprising:
a semiconductor substrate;
a first conductive feature over the semiconductor substrate;
a first dielectric layer over the semiconductor substrate and surrounding the first conductive feature;

a second conductive feature over the first conductive feature, wherein a portion of the second conductive feature is at least partially surrounded by the first conductive feature;

a second dielectric layer over the first dielectric layer and surrounding the second conductive feature; and an etch stop layer between the first dielectric layer and the second dielectric layer, wherein a topmost surface of the etch stop layer is between a top surface of the first conductive feature and a bottom surface of the first conductive feature, and the topmost surface of the etch stop layer is substantially planar.

12. The semiconductor device as claimed in claim 11, wherein the first conductive feature comprises copper, and the second conductive feature comprises cobalt.

13. The semiconductor device as claimed in claim 11, wherein the second conductive feature is in direct contact with the first conductive feature.

14. The semiconductor device as claimed in claim 11, further comprising:

a third conductive feature over the second conductive feature, wherein a portion of the second conductive feature is at least partially surrounded by the third conductive feature; and a third dielectric layer over the second dielectric layer and surrounding the third conductive feature.

15. The semiconductor device as claimed in claim 14, further comprising a barrier layer between the third conductive feature and the third dielectric layer, wherein the barrier layer is also between the third conductive feature and the second conductive feature.

16. A semiconductor device, comprising:

a semiconductor substrate;

a first conductive feature over the semiconductor substrate;

a first dielectric layer over the semiconductor substrate and surrounding the first conductive feature;

a second conductive feature over the first conductive feature, wherein the second conductive feature penetrates into the first conductive feature;

a second dielectric layer over the first dielectric layer and surrounding the second conductive feature; and an etch stop layer between the first dielectric layer and the second dielectric layer, wherein a topmost surface of the etch stop layer is between a top surface of the first conductive feature and a bottom surface of the first conductive feature, and the topmost surface of the etch stop layer is substantially planar.

17. The semiconductor device as claimed in claim 16, wherein the first conductive feature is in direct contact with the second conductive feature such that no barrier layer that is made of a material different from the first conductive feature and the second conductive feature is between the first conductive feature and the second conductive feature.

18. The semiconductor device as claimed in claim 16, further comprising an intermediate dielectric layer between the second dielectric layer and the etch stop layer, wherein the intermediate dielectric layer surrounds a portion of the first conductive feature and a portion of the second conductive feature.

19. The semiconductor device as claimed in claim 18, further comprising a second etch stop layer between the second dielectric layer and the intermediate dielectric layer, wherein the second etch stop layer surrounds a portion of the second conductive feature.

20. The semiconductor device as claimed in claim 19, wherein the first conductive feature is in direct contact with the second etch stop layer.

* * * * *